United States Patent [19]
Yoshida et al.

[11] Patent Number: 5,899,375
[45] Date of Patent: May 4, 1999

[54] BUMP BONDER WITH A DISCARD BONDING AREA

[75] Inventors: Koichi Yoshida, Higashi-Osaka; Akihiro Yamamoto, Kobe; Takahiro Yonezawa; Makoto Imanishi, both of Neyagawa, all of Japan

[73] Assignee: Matsushita Electric Industrial Co., LTD., Japan

[21] Appl. No.: 08/936,616

[22] Filed: Sep. 24, 1997

[30] Foreign Application Priority Data

Sep. 27, 1996 [JP] Japan ................................ 8-255220

[51] Int. Cl.⁶ .............................. B23K 37/00; B23K 1/06
[52] U.S. Cl. .......................... 228/4.5; 228/180.5; 228/1.1
[58] Field of Search ........................ 226/1.1, 4.5, 44.7, 226/180.5, 180.22, 102

[56] References Cited

U.S. PATENT DOCUMENTS

| | | | |
|---|---|---|---|
| 4,705,204 | 11/1987 | Hirota et al. | 228/179 |
| 5,110,032 | 5/1992 | Akiyama et al. | 228/102 |
| 5,172,851 | 12/1992 | Matsushita et al. | 228/179 |
| 5,263,246 | 11/1993 | Aoki | 29/843 |
| 5,438,020 | 8/1995 | Grancher et al. | 437/183 |
| 5,601,740 | 2/1997 | Eldridge et al. | 219/130.4 |
| 5,813,115 | 9/1998 | Misawa et al. | 29/832 |

*Primary Examiner*—Patrick Ryan
*Assistant Examiner*—Carlos J. Gamino
*Attorney, Agent, or Firm*—Parkhurst & Wendel, L.L.P.

[57] ABSTRACT

The object is to provide a bump bonder wherein the drop of the tact efficiency of bump formation can be reduced to a low level by discard-bonding of unsatisfactory balls (3) so that satisfactory bumps can be formed. It features arranging a discard bonding chip (19) on bonding stage (17), which holds in their prescribed positions the semiconductor chips (13a), (13b) that are to be subjected to bump formation and performing discard bonding to discard bonding chip (19). Due to this construction, discard bonding can be effected without needing to move the capillary far from the bonding stage (17), which is the working position.

2 Claims, 5 Drawing Sheets

BUMP BONDER WITH A DISCARD BONDING AREA

BACKGROUND OF THE INVENTION

1. Field of the Invention

The present invention relates to bump bonders whereby bumps are formed on electrodes of semiconductor chips when mounting semiconductor chips on a wiring board.

2. Description of the Related Art

The existing methods for mounting semiconductor chips on wiring boards include [the method] as shown in FIG. 3 of electrically connecting electrodes 14 of a semiconductor chip 13 with lead frames 15 of a wiring board using Au wire 16 and the method as shown in FIG. 9 of forming Au bumps 7 beforehand on electrodes 5 of semiconductor chip 4 and electrically connecting semiconductor chip 4 formed with these Au bumps 7 with electrodes 12 of wiring substrate 11 by means of conductive adhesive 10.

The device that is used to effect electrical connection with Au wires 16 is called a "wire bonder". The device that is used to effect electrical connection with Au bumps 7 is called a "bump bonder".

FIG. 5 shows how bonding is performed by a bump bonder.

First of all, as shown in FIG. 5, a ball 3 is formed by melting, using a spark current, the tip of an Au wire 2 that is drawn through a capillary 1. This ball 3 is joined to electrode 5 of semiconductor chip 4 by applying ultrasound simultaneously with heat and pressure; after bonding has been achieved, capillary 1 is moved to form a loop 6 of Au wire 2 directly above ball 3 as shown in FIG. 6. Au wire 2 is then severed to leave this loop 6 behind.

In a semiconductor chip 4, with bumps 7 consisting of balls 3 and loops 6 formed in this way using a bump bonder on all the electrodes 5 of semiconductor chip 4, the projecting end faces of bumps 7 are simultaneously flattened as shown in FIG. 7 by pressing all the bumps 7 onto a moulding base 8 of defined surface flatness so that all the bump heights are made uniform.

Next, a paste-like coating of conductive adhesive 10 is transferred to the periphery of bumps 7 of semiconductor chip 4 as shown in FIG. 8. At this point, conductive adhesive 10 whose binder is epoxy resin is provided in uniform thickness on the upper surface of moulding base 9 of defined flatness. When loops 6 that have been adjusted to uniform height are pulled up after being collectively pressure-fixed, a paste-like coating of conductive adhesive 10 is stuck onto the upper face of all the bumps 7.

Then, as shown in FIG. 9, mounting is completed by joining bumps 7 of semiconductor chip 4 in positionally-aligned condition to a plurality of conductive films 12 formed in a pattern on wiring board 11 by means of conductive adhesive 10 and heat-hardening conductive adhesive 10 by heating.

In the case of a bump bonder, it is necessary to form a ball 3 beforehand at the tip of Au wire 2, so, in forming the ball beforehand at the tip of Au wire 2, in order to obtain satisfactory bumps 7, discard bonds are required whereby any unsatisfactory balls 3 may be removed until satisfactory balls 3 can be produced.

In the discard-bond step, as shown in FIG. 4, unwanted wire or balls are bent at the capillary tip; bonding is performed to semiconductor chip 4 for discard bonding and thereafter a ball 3 is formed by spark application from battery 11 to wire 2 which is drawn out to a prescribed length.

In the case of a wire bonder, the operation of electrically connecting electrodes 14 of semiconductor chip 13 with lead frame 15 of the wiring board by Au wire 16 by discard-bonding in free areas 15a of lead frame 15 shown by virtual lines in FIG. 3 can be continued, but, in the case of bump bonding, the present situation is that, in the case of a semiconductor chip 4 of small surface area, it is not possible to secure enough area for the discard bonds that are to be removed.

An object of the present invention is to provide a bump bonder whereby satisfactory bumps 7 can be formed by discard-bonding of unwanted wires and/or unsatisfactory balls 3 by suppressing to a very low level the lowering of tact efficiency of formation of bumps 7.

SUMMARY OF THE INVENTION

In a bump bonder according to the present invention, on the bonding stage that holds the semiconductor chip that is to be subjected to the formation of bumps in a prescribed position, a discard-bonding chip is arranged in a position adjacent the prescribed position and discard bonding is performed to the discard-bonding chip.

With the present invention, a bump bonder is obtained whereby discard bonding can be achieved without moving the capillary very much from the bonding stage, which is the working position.

In a bump bonder according to embodiment, a semiconductor chip is held at a prescribed position on the upper surface of a bonding stage and, by moving metal wire formed with a ball by melting its tip over the electrodes of the semiconductor chip by means of a capillary, bumps are formed by joining the balls formed at the tip of the metal wire to the electrodes of the semiconductor chip, and the bump bonder is so constructed that a discard-bonding chip is arranged at the upper surface of the bonding stage and in a position adjacent the prescribed position; discard bonding being effected by moving the capillary to the position of the discard-bonding chip arranged on the bonding stage when bumping means for controlling drive that control movement of the capillary.

Consequently, a semiconductor chip can be formed with satisfactory bumps by ensuring that discard bonding can be performed without needing to move the capillary much from the bonding stage which is the working position and that the tact efficiency is only slightly lowered.

In a bump bonder according to the embodiment, within the means for the controlling drive that controls movement of the capillary, the need for discard bonding is determined and when discard bonding is necessary, discard bonding is performed by executing bumping at the position where the discard-bonding chip is located on the bonding stage, and bumping is subsequently performed with the capillary moved to the working position on a semiconductor chip.

Automated operation in continuous processing can thereby be achieved.

DESCRIPTION OF THE PREFERRED EMBODIMENTS

A bump bonder according to the present invention is described below with reference to FIG. 1 and FIG. 2.

Figure 5:
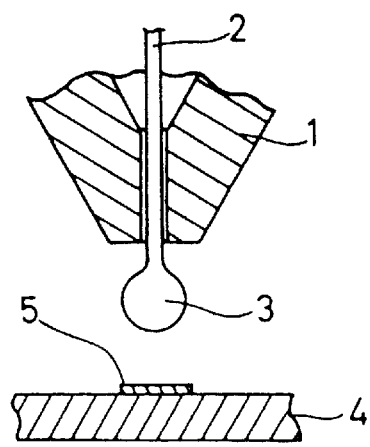
FIG. 5 is a diagram of a step for forming a ball at the tip of a capillary in the conventional method of mounting a semiconductor chip.
Figure 6:
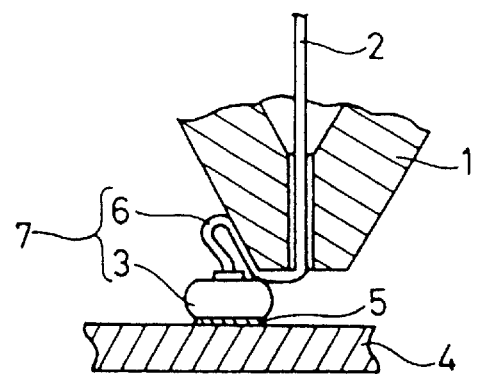
FIG. 6 is a diagram of a step for joining balls to electrode pads of a semiconductor chip in a bump bonder and forming metal wire loops directly above the balls.
Figure 7:
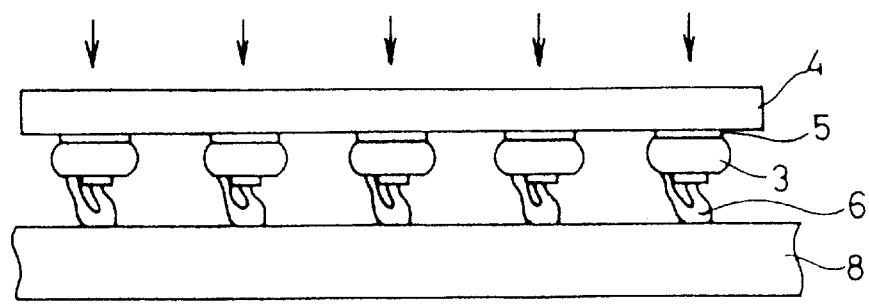
FIG. 7 is a diagram of a step of pushing the formed bumps onto a moulding base.
Figure 8:
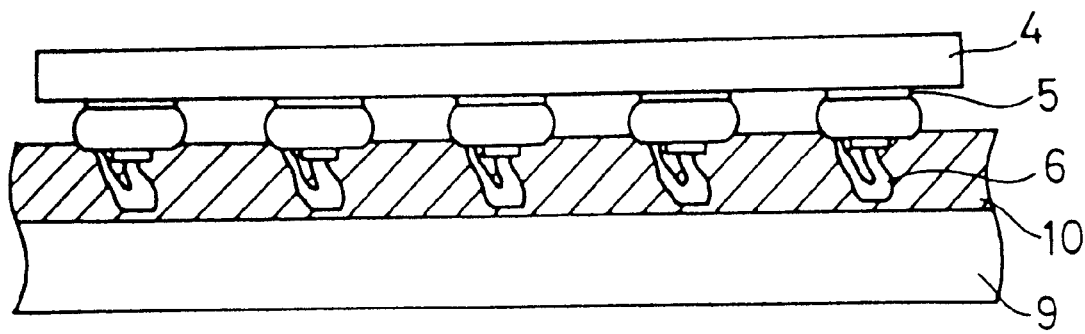
FIG. 8 is a diagram of a step for transferring a paste-like coating of conductive adhesive at the periphery of the bumps to a semiconductor chip.
Figure 9:
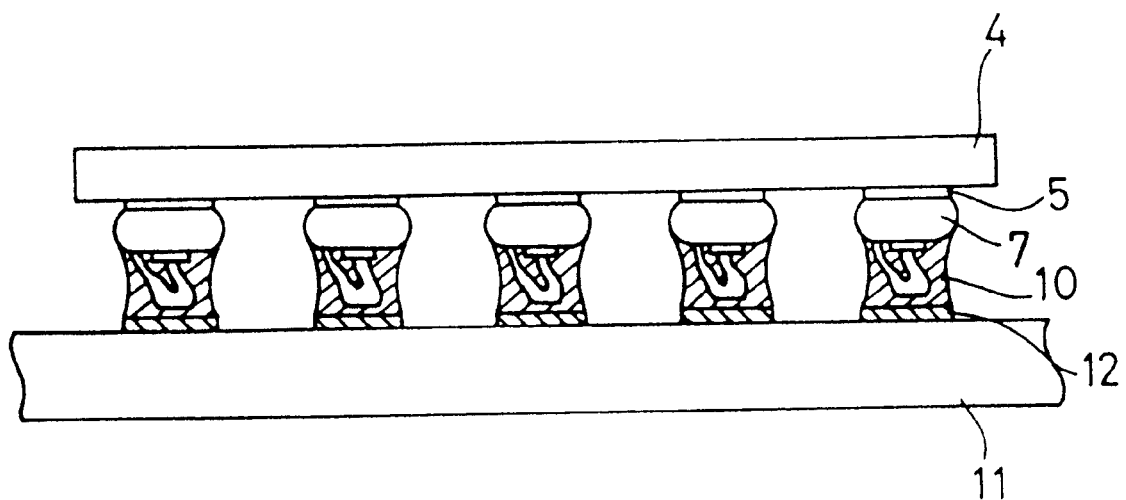
FIG. 9 is a diagram of a step for joining a semiconductor chip to a conductive film of a wiring board.

Parts which have the same function as in FIG. 5 and FIG. 6 which illustrate the prior art example are given the same reference symbols.

Figure 1:
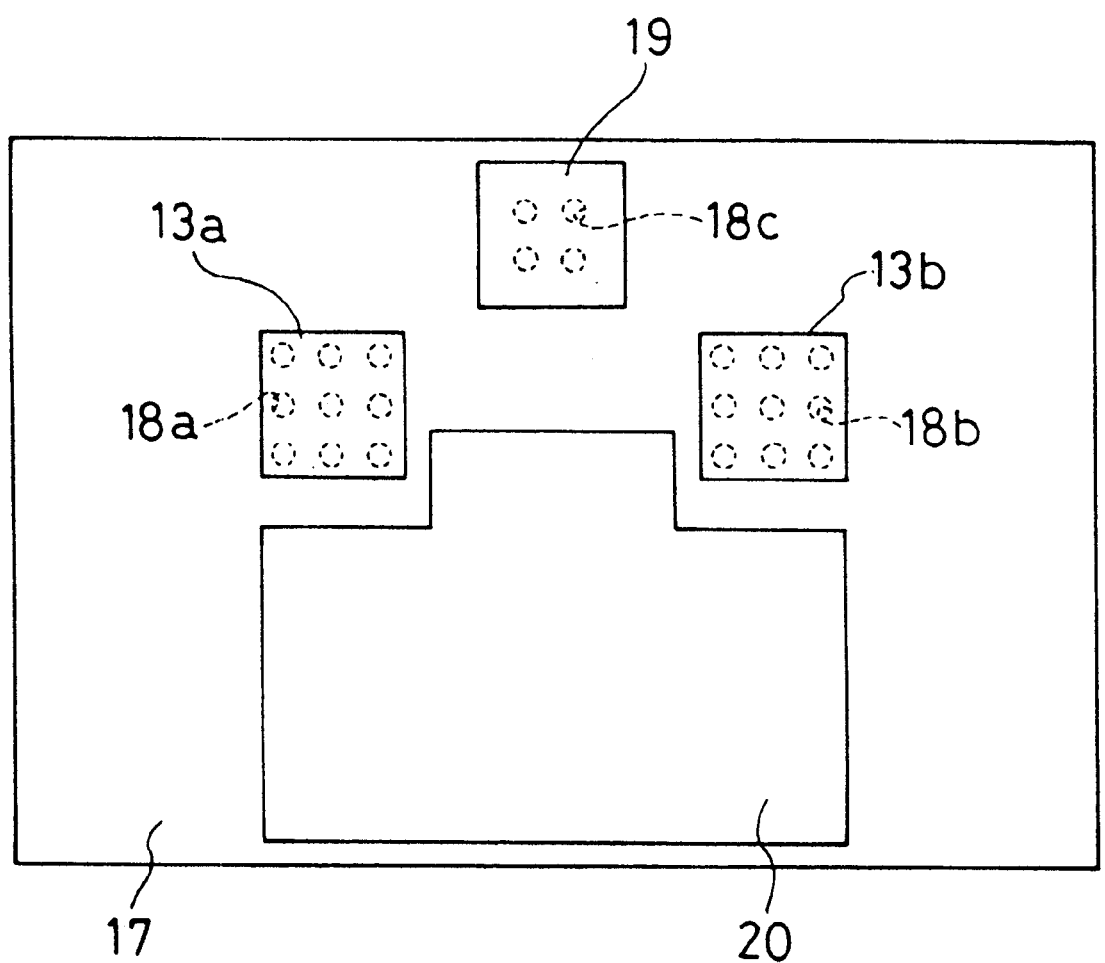
FIG. 1 is a plan view of a bonding stage of an embodiment.
Figure 2C:
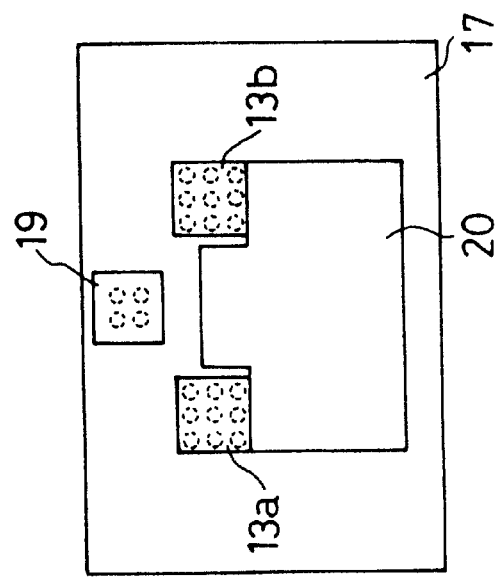
FIGS. 2A, 2B, 2C and 2D illustrate steps of the bumping of the embodiment.
Figure 2D:
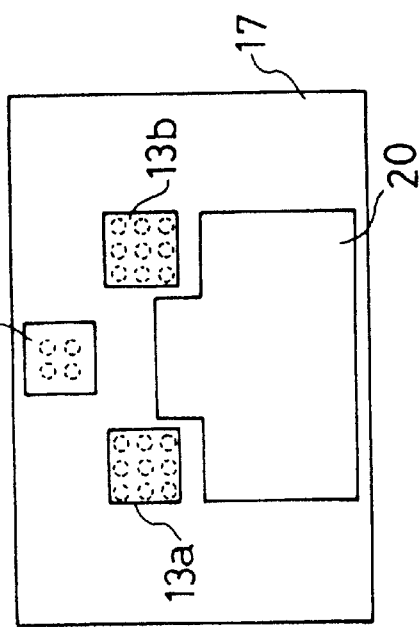
Figure 2A:
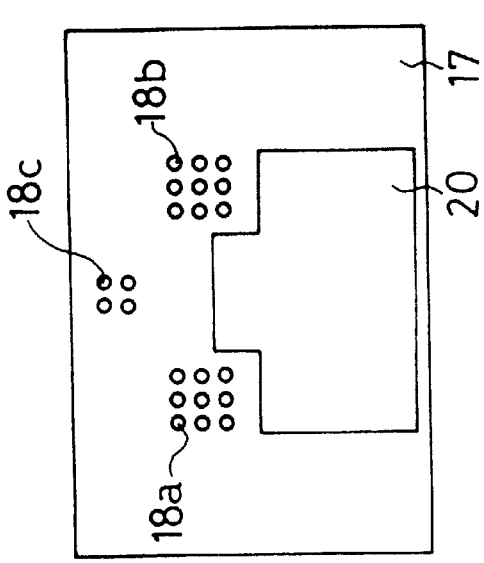

With the bump bonder according to the present invention, as shown in FIG. 1 and FIG. 2A, in bonding stage 17, there are formed first and second suction holes 18a, 18b in positions that receive bump formations where semiconductor chips 13a, 13b are held. Furthermore, in bonding stage 17 there is formed a third suction hole 18c adjacent to first and second suction holes 18a, 18b. A vacuum source is connected to first~third suction holes 18a~18c.

Figure 2B:
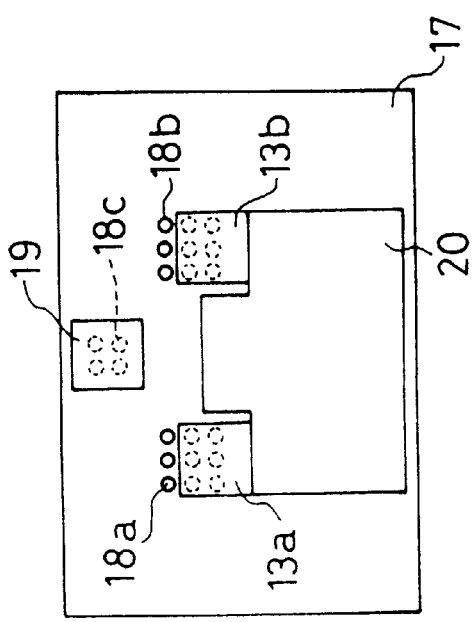
Figure 3:
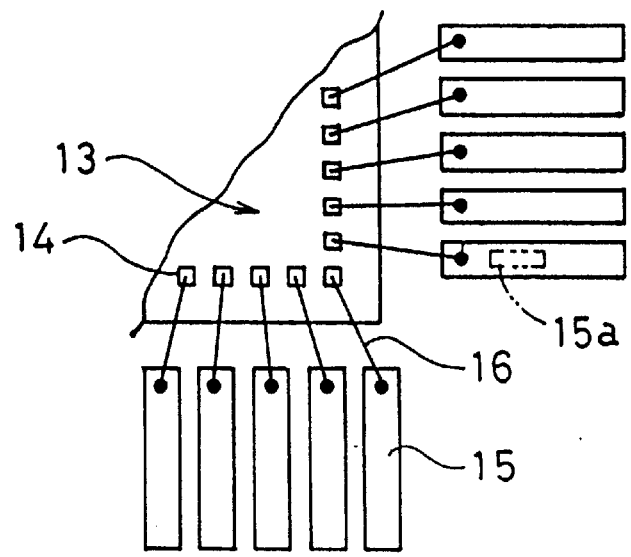
FIG. 3 is a diagram of a wire bonder.
Figure 4:
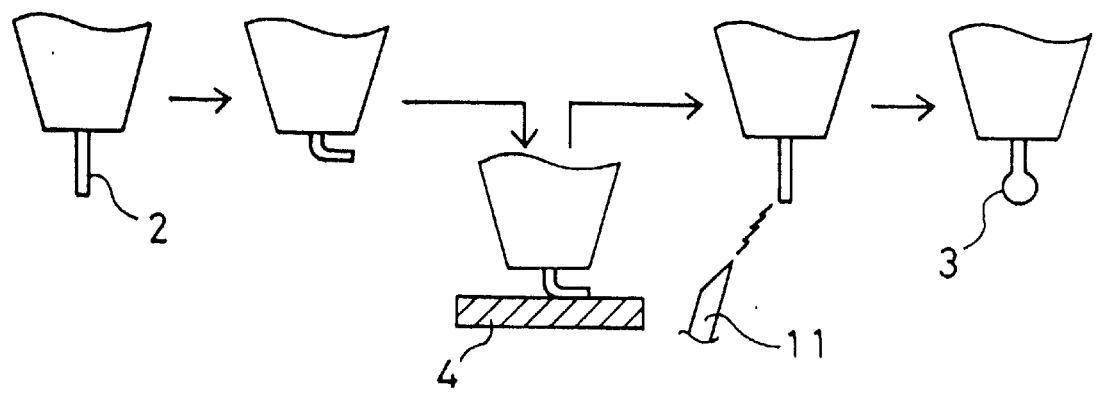
FIG. 4 is a diagram illustrating a discard-bond step.

At the commencement of bumping, as shown in FIG. 2B, an Al chip 19 constituting a discard-bonding chip is arranged and held by suction in the position of third suction hole 18c of bonding stage 17.

In this condition, semiconductor chips 13a, 13b are arranged in positions in front of first and second suction holes 18a, 18b of bonding stage 17 and thusarranged semiconductor chips 13a, 13b are set accurately in the working positions by sliding a plate-shaped locating plate 20 as shown in FIG. 2C along the upper surface of bonding stage 17, with semiconductor chips 13a, 13b pushed into the working positions at the positions of first and second suction holes 18a, 18b. When setting of semiconductor chips 13a, 13b in the working positions at the positions of first and second suction holes 18a, 18b has been completed, locating plate 20 is returned to its initial position as shown in FIG. 2D. In this condition, bumps 7 are formed on the electrodes of semiconductor chips 13a, 13b, by moving capillary 1, and means for controlling drive that control the movement of capillary 1 are constituted as follows.

The means for controlling drive are constituted such that they ascertain the need for discard bonding, and, if discard bonding is needed, in bumping, discard bonding is executed by performing bumping at the position of Al chip 19 for discard bonding, bumping then being performed by moving capillary 1 to the working position of semiconductor chips 13a, 13b.

Specifically, the means for controlling drive, when ball 3 is formed by melting the tip of Au wire 2 by a spark current, measure the spark current, and, if the current value obtained by the measurement is outside the prescribed range, conclude that it has not been possible to form a satisfactory ball 3 and implement discard bonding by performing bumping at the position of Al chip 19 as described above. The discard bonding is repeated once or more times. In more detail, bumping of semiconductor chips 13a, 13b is implemented in conditions of stable temperature of ball 3 by carrying out bumping five times at the position of Al chip 19.

Also, if it is concluded that satisfactory balls 3 could not have been formed during execution of the bumping to semiconductor chips 13a, 13b, returns to execution of bumping to semiconductor chips 13a, 13b after executing discard bonding two or three times by performing bumping at the position of Al chip 19.

It should be noted that the means for controlling drive could be implemented by a microcomputer. Also, if wire and/or a ball 3 do not appear at the tip of the capillary, the initial ball could be formed by automatically drawing the wire out and generating sparks.

In this way, due to the adoption of a construction in which discard bonding is performed on Al chips 19 after arranging Al chips 19 adjacent the working position of semiconductor chips 13a, 13b, continuous automatic operation can be achieved and in addition, compared with the case where discard bonding is effected in locations other than bonding stage 17, only a small amount of movement of capillary 1 is required, enabling the efficiency of tact to be raised.

What is claimed is:

1. A bump bonder wherein a semiconductor chip is held at a prescribed position on the upper surface of a bonding stage and, by moving a metal wire with a ball formed at its by melting its tip over the electrodes of the semiconductor chip by means of a capillary, bumps are then formed by joining the balls at the tip of the metal wire to the electrodes of the semiconductor chip, so constructed that a discard-bonding chip is arranged on the upper surface of the bonding stage and in a position adjacent the prescribed position;

discard bonding being effected by moving the capillary to the position of the discard-bonding chip by means of a controlling drive that controls movement of the capillary.

2. The bump bonder according to claim 1 wherein the means for the controlling drive that control movement of the capillary the need for discard bonding is determined and, when discard bonding is necessary discard bonding is performed by executing bumping at the position where the discard-bonding chip is located on the bonding stage, and forming of the ball is subsequently performed when the capillary is moved back to the working position on the semiconductor chip.

* * * * *